United States Patent
Thomson

(10) Patent No.: US 7,126,504 B2
(45) Date of Patent: Oct. 24, 2006

(54) METHODS AND SYSTEMS FOR FILTERING UNWANTED NOISE IN A MATERIAL METERING MACHINE

(75) Inventor: Malcolm G. Thomson, Suwanee, GA (US)

(73) Assignee: Process Control Corporation, Atlanta, GA (US)

(*) Notice: Subject to any disclaimer, the term of this patent is extended or adjusted under 35 U.S.C. 154(b) by 0 days.

(21) Appl. No.: 10/753,708

(22) Filed: Jan. 8, 2004

(65) Prior Publication Data
US 2004/0145502 A1    Jul. 29, 2004

Related U.S. Application Data

(63) Continuation of application No. 10/340,310, filed on Jan. 9, 2003, now Pat. No. 6,774,822.

(51) Int. Cl.
H03M 7/00    (2006.01)

(52) U.S. Cl. ......................... 341/61; 341/155

(58) Field of Classification Search .......... 341/61, 341/144, 155, 143; 708/322, 313; 375/346, 375/326; 700/280; 381/71.2; 702/45; 600/519
See application file for complete search history.

(56) References Cited

U.S. PATENT DOCUMENTS

| | | | | |
|---|---|---|---|---|
| 5,058,047 A | * | 10/1991 | Chung | 708/322 |
| 5,157,395 A | * | 10/1992 | Del Signore et al. | 341/143 |
| 5,313,407 A | * | 5/1994 | Tiernan et al. | 700/280 |
| 5,349,352 A | | 9/1994 | Saleh | |
| 5,386,372 A | * | 1/1995 | Kobayashi et al. | 700/280 |
| 5,410,606 A | * | 4/1995 | Imai et al. | 381/71.14 |
| 5,425,057 A | * | 6/1995 | Paff | 375/326 |
| 5,555,190 A | * | 9/1996 | Derby et al. | 702/45 |
| 5,579,247 A | | 11/1996 | Kerth | |
| 5,586,100 A | * | 12/1996 | Lee et al. | 369/53.33 |
| 5,619,581 A | * | 4/1997 | Ferguson et al. | 381/71.12 |
| 5,680,418 A | * | 10/1997 | Croft et al. | 375/346 |
| 5,764,113 A | * | 6/1998 | Snell | 332/103 |
| 5,842,160 A | * | 11/1998 | Zinser | 704/229 |
| 5,876,350 A | * | 3/1999 | Lo et al. | 600/519 |
| 5,940,519 A | * | 8/1999 | Kuo | 381/71.11 |
| 6,108,622 A | * | 8/2000 | Xue et al. | 704/212 |
| 6,169,506 B1 | | 1/2001 | Oprescu et al. | |

(Continued)

OTHER PUBLICATIONS

PCT International Search Report issued in connection with corresponding application PCT/US2004/000396 PCT Written Opinion issued in connection with corresponding application PCT/US2004/000396.

Primary Examiner—Jean Bruner Jeanglaude
(74) Attorney, Agent, or Firm—Todd Deveau; Thomas, Kayden, Horstemeyer & Risley LLP

(57) ABSTRACT

Methods and systems for filtering an analog signal sampled at a very high frequency and outputting a digital signal that has a very low sampling frequency to drive a material metering machine. The high frequency digital input signal is input to a first decimation element, which filters out the noise in the signal introduced by an analog-to-digital (A/D) converter and reduces the sampling frequency of the digital signal to a lower sampling frequency of 1200 hertz. The reduced rate digital signal is input into a second decimation element that contains several decimation filters, which reject the 60 hertz line noise and its harmonics while simultaneously reducing the sampling frequency of the digital signal to 10 hertz. The output of the second decimation element is then passed to a bank of selectable filters with sub-hertz cutoff frequencies to remove the machine noise from the material metering machine.

31 Claims, 11 Drawing Sheets

U.S. PATENT DOCUMENTS 6,208,739 B1 * 3/2001 Venugopal et al. ...... 381/71.12
6,212,566 B1 * 4/2001 Vanhoof et al. ............ 709/230
6,233,594 B1 * 5/2001 Tan et al. ................... 708/313
6,411,242 B1 * 6/2002 Oprescu et al. ............. 341/155
6,603,812 B1    8/2003 Oprescu

* cited by examiner

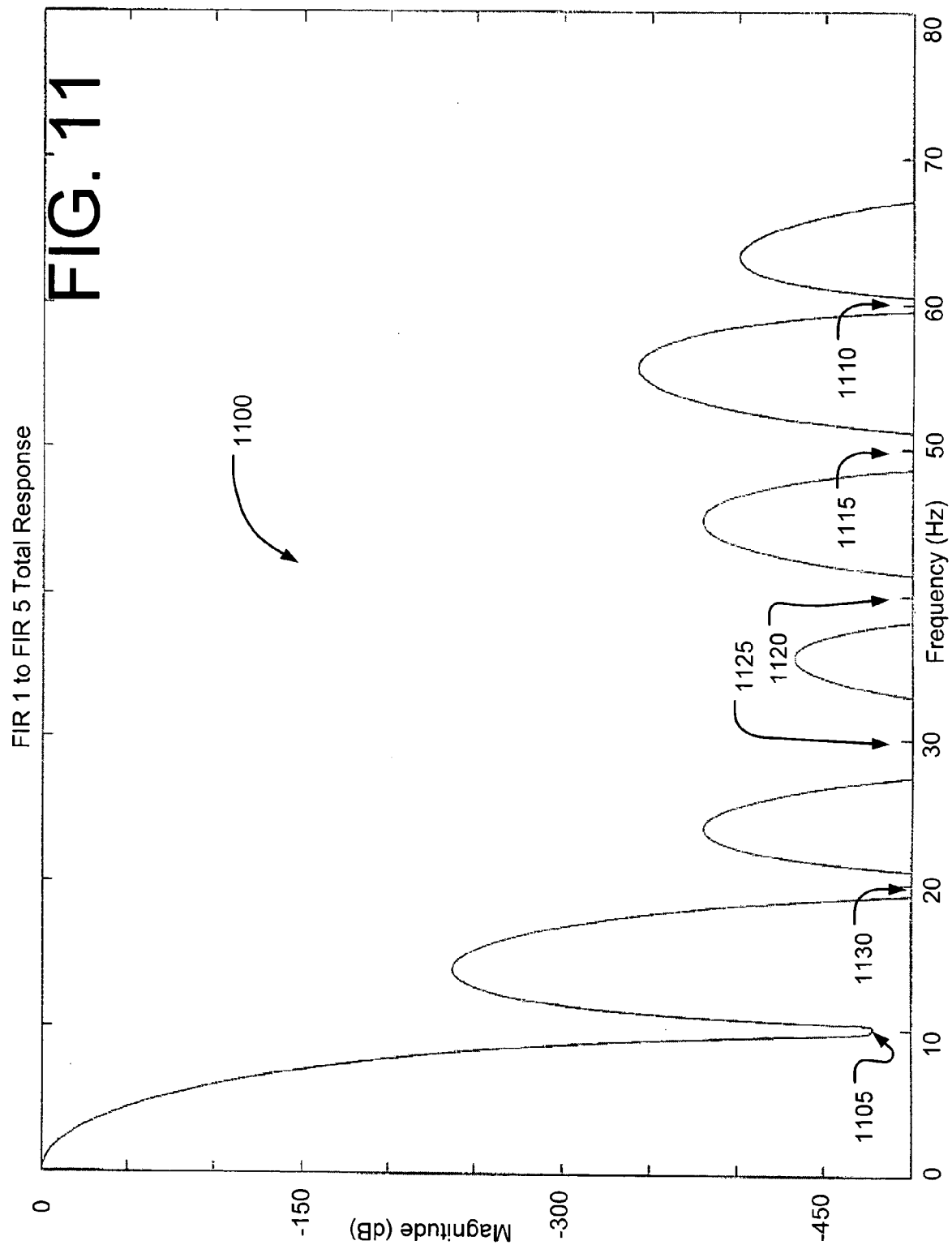

METHODS AND SYSTEMS FOR FILTERING UNWANTED NOISE IN A MATERIAL METERING MACHINE

CROSS-REFERENCE TO RELATED APPLICATIONS

This application is a continuation of U.S. patent application having Ser. No. 10/340,310, filed on Jan. 9, 2003, now issued as U.S. Pat. No. 6,774,822.

TECHNICAL DESCRIPTION OF THE INVENTION

The present invention is directed to decimation filters, and more particularly to a chain of finite impulse response (FIR) filters for decimating a digital signal with a high sampling frequency, down to a digital signal with a low sampling frequency, having a long word length while simultaneously filtering out line noise introduced by the line voltage.

BACKGROUND

In the application of material metering machines, load cells are relied upon to provide basic weight measurements. Typically, the material is loaded into a hopper, or a vessel, which is attached to the load cell. As the material passes out of the hopper at the bottom, new material is fed into the top of the hopper. The load cell monitors the weight of the hopper and passes those measurements to a processor which calculates the flow rates from the vessels. One area of technology where the material metering machines are used is for resinous or plastic materials. Typically, the resinous or plastic material is in the form of a pellet, of which there are approximately 30 to 80 to a gram. The pellets are passed though a weigh vessel one at a time, or at most a few at a time. Because the vessels have a high tare weight, which may be several thousand pounds, the weigh board must be able to monitor very minute changes in weight to insure the proper flow rate.

However, in this environment there are many sources of noise, both electrical and mechanical. For example, electrical noise may be introduced by converting the analog signal from the load cell to a digital signal that is used by a feedback loop to control the flow rate of the material through the vessel. Another source of electrical noise is line noise, which is the noise introduced into the system by the power supply.

Measurements of the resinous pellets flowing through the hoppers must be made with great accuracy. This is due to the fact that the resinous pellets are very light. Plastic blending machines, which use plastic or resinous pellets, require very precise measurements that are needed for low recipe ratios and run rates in the presence of noise and high tare weights.

To meet the strict requirements needed by plastic blending machines, special purpose digital signal processors (DSPs), which contain the signal processing and filtering function on a single chip are required to minimize the amount of noise introduced into the system. The single chip devices currently available offer limited filtering capabilities and are relatively expensive. Presently, the single chip DSPs do not provide filtering capabilities for the 50 Hz and 60 Hz line noise introduced into the system by power supply, which is a significant factor when carrying out the precise weight measurements needed for plastic blending machines.

Several methods are currently used to reduce the noise from material metering machines. One method uses active vibration control, wherein undesired noise or other vibrations are reduced or eliminated by adding an equal and opposite amount of noise or vibration. Active vibration control is only used to eliminate mechanical noise, such as the noise introduced by the moving parts of the machine. Additionally, active vibration control systems can be relatively expensive because the systems require specialized components and a great amount of processing power. Furthermore, active vibration control methods do not reduce the noise added to the system from the line voltage.

Another method to remove unwanted noise from machine metering systems uses adaptive notch filtering, also known as Adaptive Line Enhancement (ALE). Under the ALE method, vibrations are converted to a digital signal at a fixed frequency by an analog-to-digital (A/D) converter. The digital signal is then applied to a decimation filter to reduce the number of samples used in subsequent calculations. The decimation filter also provides some anti-aliasing filtering to smooth the signal. The decimated signal is then applied to an adaptive notch filter to enhance the signal by filtering most of the noise and harmonics. Although the ALE method filters out most of the unwanted noise and enhances the rejection characteristics of the filtration, the ALE method does not filter out the noise generated by the line voltage at the 50 Hz and 60 Hz frequencies, which can introduce errors in the flow rate of plastic blending machines. Furthermore, the ALE method requires additional processing power over conventional methods, which increases the cost of the system.

Thus, there is a need in the art for an inexpensive noise reduction method to reduce the noise, both electronic and mechanical, from material metering machines. There is a further need in the art for a noise reduction system for use with material metering machines to filter out line noise associated with the 50 Hz and 60 Hz frequencies to provide an output signal that has the stability to drive material metering machines that require precise measurements needed to achieve low mixing ratios in the presence of high tare weights.

SUMMARY

The present invention meets the above-described needs in an apparatus for filtering a digital signal that is sampled at a very high frequency and generating a digital output signal with a very low sampling frequency that has also been filtered to remove line noise introduced by the apparatus' power supply. Generally described, the apparatus first receives a digital signal, which has been sampled at a high frequency rate. The high frequency input signal is passed to a first decimation element, which contains at least one digital filter. The first decimation element removes the noise in the signal introduced by an analog-to-digital (A/D) converter. The first decimation element also conditions the signal by reducing the sampling frequency of the digital signal required by a second decimation element.

The second decimation element receives the digital signal from the first decimation element at a reduced sampling frequency. The second decimation element filters out noise introduced in the signal from the line voltage by passing the signal through a series of decimation filters. Each of the filters provides rejection of the 60 Hz line noise and its harmonics while simultaneously reducing the sampling frequency of the digital signal. The resultant output of the second decimation element is a digital signal having a long word length and sampled at a very low frequency. In an exemplary embodiment, the digital output signal is 20 bits wide and has a sampling frequency of 10 Hz, providing a decimation ratio of 120:1.

To achieve the decimation ratio of 120:1, the second decimation element contains a series of filters that each has a particular decimation ratio. For example, the second decimation element can contain three filters that reduce the sampling frequency of the signal from 1200 Hz to 10 Hz in a series of successive steps. The first filter in this example has a decimation ratio of 2:1, thereby reducing the sampling frequency of the signal from 1200 Hz to 600 Hz. The first filter however, has an averaging length of 20, which produces nulls at multiples of 30 Hz. The longer filter length filters out noise introduced by the line voltage at the 60 Hz frequency while providing the decimated signal sampled at 600 Hz.

The second filter in the second decimation element has a decimation ratio of 10:1. The second filter receives the output signal from the first filter at the sampling frequency of 600 Hz and outputs a digital signal sampled at 60 Hz. Instead of using a conventional filter of length 10, the second filter has an averaging length of 20, which produces nulls in the frequency response at multiples of 30 Hz, which further reduce the line noise in the signal while simultaneously creating null at the 60 Hz frequency and its harmonics.

The third filter in the second decimation element has a decimation ratio of 6:1 to reduce the sampling frequency of the digital signal from 60 Hz to 10 Hz. The third filter has a conventional length of 6, which provides the appropriate decimation ratio and produces nulls at integer multiples of 10 Hz to further filter out the line noise at 60 Hz and also at 50 Hz.

The apparatus can additionally contain a bank of selectable filters, which are used to filter out the machine noise from the material metering machine. Each filter in the filter bank has a sub-hertz 3-dB cutoff frequency. The selection of a particular filter is a function of the machine's operating characteristics and is based on the closed loop performance during the operation of the material metering machine.

The apparatus can additionally contain a digital signal processor (DSP) unit that conditions the input signal from the weigh board associated with the material metering machine before it is applied to the decimation elements. The DSP receives an analog data signal from the weigh board attached to the material metering machine and conditions the signal by passing it through a differential filter to provide anti-aliasing filtering. The filtered analog signal is passed through an analog-to-digital (A/D) converter before being sent to the first decimation element.

The various aspects of the present invention may be more clearly understood and appreciated from a review of the following detailed description of the disclosed embodiments and by reference to the appended drawings and claims.

BRIEF DESCRIPTION OF THE FIGURES

FIG. 11 is an illustration of an exemplary response curve for the overall FIR filter chain.

DETAILED DESCRIPTION OF THE EMBODIMENTS

Figure 1:
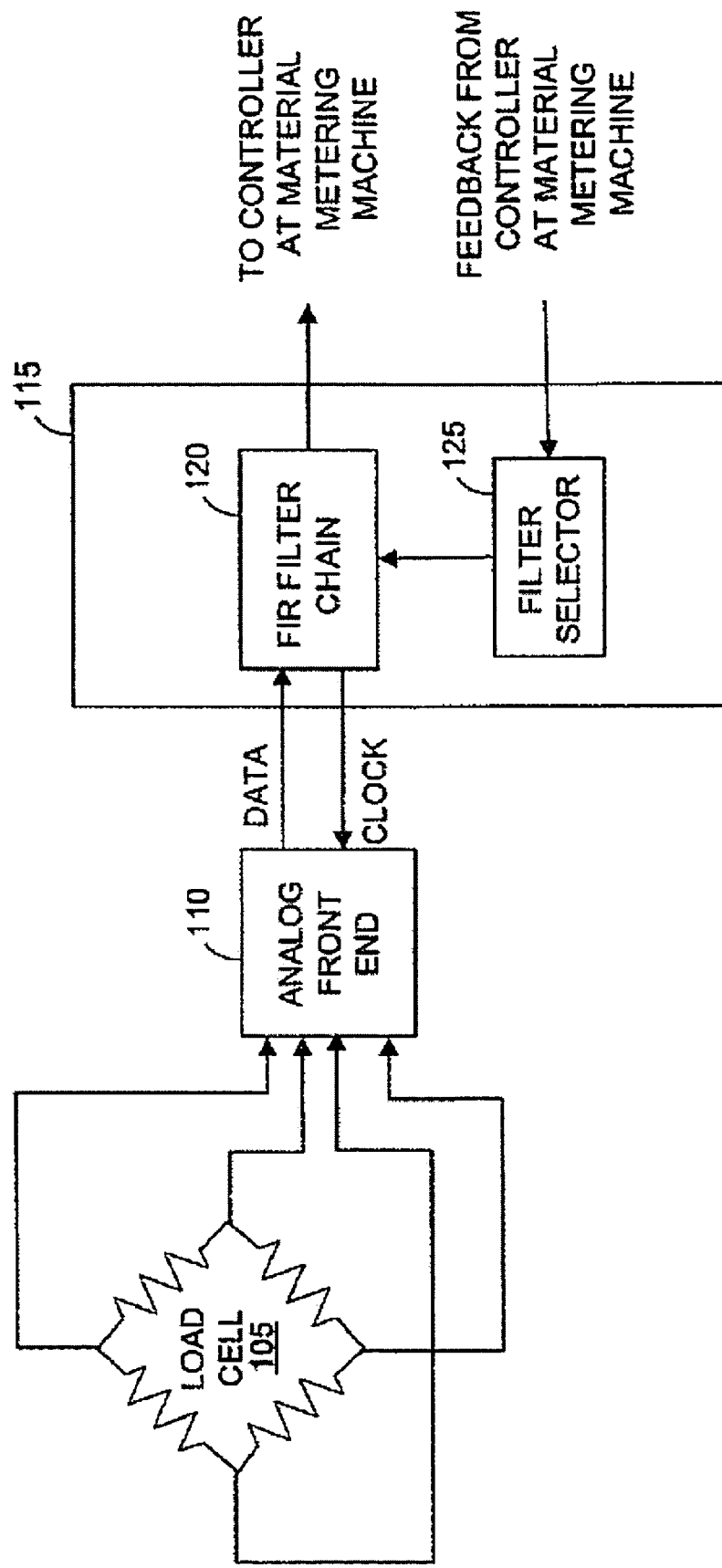
FIG. 1 is a block diagram of an exemplary weigh board circuit in accordance with the invention.

The operation of the digital filter bank begins when a load cell, also known as a strain gauge, connected to a material metering machine, receives an analog signal that is proportionate to a load placed on the load cell. A positive and negative excitation source drives the load cell, which generates an output voltage, which is proportional to the load. The output signal is a low voltage analog signal and is differential in nature. The low voltage analog signal is then fed to a digital signal processing (DSP) unit, which conditions the signal and converts it from an analog signal to a digital signal. The converted digital signal typically has a high sampling rate, normally about 307.2 kilohertz (kHz), which is within the operating range of the analog-to-digital (A/D) converter The digital signal is input to a decimation filter bank that contains a number of individual decimation filters. In the exemplary embodiment, the decimation filter bank contains five (5) finite impulse response (FIR) filters, FIR1 through FIR5. The primary purpose of FIR1 and FIR2 is to reduce noise from the A/D conversion process. The sampling rate of 307.2 kHz is used because it lies within the desired operating range of the A/D converter. It should be noted that in general, the higher the sample rate the better the performance will be, as long as the frequency is within specification of the A/D converter and that there are sufficient computational resources. The higher sampling rate offers greater opportunity for higher decimation ratios and the resulting improvement in noise performance. FIR1 and FIR2 may be combined into a first decimation element, which has a total decimation ratio of 256. The output of this block is chosen to have a sample rate output of 1200 Hz which is a harmonic multiple of 50 and 60 Hz line frequencies. This makes integer decimation ratios of the line frequencies possible.

The decimation and filtering of the signal begins when FIR1 accepts a one bit input signal from the A/D converter at the sampling rate of 307.2 kHz and outputs a 16 bit digital signal at a sampling frequency of 19.2 kHz, which provides a decimation ratio of 16:1. The digital signal from FIR1 is then input to FIR2, which accepts 16-bit input sample a rate of 19.2 kHz. FIR2 has a decimation ratio of 16:1, which provides a null at 1200 Hz required to generate a 32-bit wide digital signal sampled at 1200 Hz.

The next three filters, FIR3 through FIR5, may be combined in to a second decimation element, which has a total decimation ratio of 120. FIR3 through FIR5 provide both A/D noise reduction through decimation and line noise filtering through appropriate placement of nulls in the response curve of the system. FIR3 accepts input samples of 32 bits from FIR2 at a rate of 1200 Hz and outputs 32-bit words at a rate of 600 Hz. The moving average length of FIR3 is set at 20 to provide nulls at 60 Hz (1200/20) and its multiples, including the necessary one at 600 Hz for decimation. The remaining nulls are for line frequency noise rejection. Conventional design practice would be to select a filter length of 2 to provide the necessary null for a decimation ratio of 2. However, by using a length of 20 in the exemplary embodiment, filtering for decimation and line noise removal are performed simultaneously.

The output of FIR3 is then input to FIR4, which accepts the 32 bit input samples at a rate of 600 Hz and outputs 32 bit samples at 60 Hz. FIR4 uses a SINC filter of order 3 with a moving average length of 20. This places nulls at integral multiples of 30 Hz, thereby permitting a decimation factor of 10 to provide an output rate of 60 Hz. As with FIR3, FIR4 uses a longer filter length than necessary (20 vs. 10) to simultaneously attain the desired decimation and line frequency filtering.

FIR5 is the final decimation filter in the filter chain. FIR5 accepts the 32 bit input samples from FIR 4 at a rate of 60 Hz and outputs 32 bit samples at a frequency of 10 Hz. FIR 5 has a moving average length of 6, so there are nulls at integral multiples of 10 Hz and an order of 7 to remove the higher frequency components. This places nulls at 50 Hz and 60 Hz line frequencies and their harmonics. The selection of 10 Hz as the frequency of the output signal is selected because it fits in with the controller of the material metering machine, which polls the weigh board at 3 Hz. This provides sufficient over-sampling in the event that future controllers will be able to sample at a higher frequency.

The output from FIR5 is then input to a selectable bank of filters to remove any machine noise generated by the material metering machine. The particular filter selected to filter out the machine noise is chosen based on the material metering machine's operational characteristics, such as the rate of change of weight, material density and machine noise environment. Each of the filters in the selectable filter bank receives input signals sampled at 10 Hz and output sample rate of 10 Hz. Each of the filters has a sub-hertz 3-dB cutoff frequency. This allows the response of the filters to track the change in weight of the material while simultaneously filtering out machine related noise.

Turning now to the figures, in which like numerals refer to like elements through the several figures, FIG. 1 is a block diagram of a load cell circuit 100 for filtering out unwanted noise from a signal generated by a load cell associated with a material metering machine. The load cell circuit 100 comprises a load cell 105, which is typically a bridge circuit that provides an analog differential output voltage. The differential output voltage is directly proportional to the stress applied to the load cell 105. The analog differential voltage is then applied to the Analog Front End unit 110, where it is conditioned and converted to a digital signal and forwarded to a digital signal processing (DSP) unit 115. The DSP unit 115 in the exemplary embodiment is implemented on a 56F803 DSP manufactured by the Motorola Corporation of Schaumburg, Ill. The Motorola 56F803 DSP is a 16-bit processor operating at 40 MHz. The 56F803 DSP was chosen because of its high speed and because the processor performs 16-bit by 16-bit multiplication and has a 36-bit accumulator. Those skilled in the art will appreciate that other DSP units may that have different processing speeds may be used in accordance with the invention described herein. It should also be appreciated that DSP with larger processors, such as 32-bit processors may also be used without departing from the scope of the invention.

The DSP unit 115 inputs a high frequency digital signal with a sampling rate greater than 300 kHz. In the exemplary embodiment, the DSP unit 115 inputs a digital signal sampled at 307.2 kHz, which is input to a FIR filter chain unit 120. The FIR filter chain unit 120 decimates the sampling frequency of the signal from the initial frequency of 307.2 kHz down to a low frequency rate to input into a selectable filter bank to remove unwanted mechanical noise inserted by the material metering machine, which in the exemplary embodiment is 10 Hz.

Figure 2:
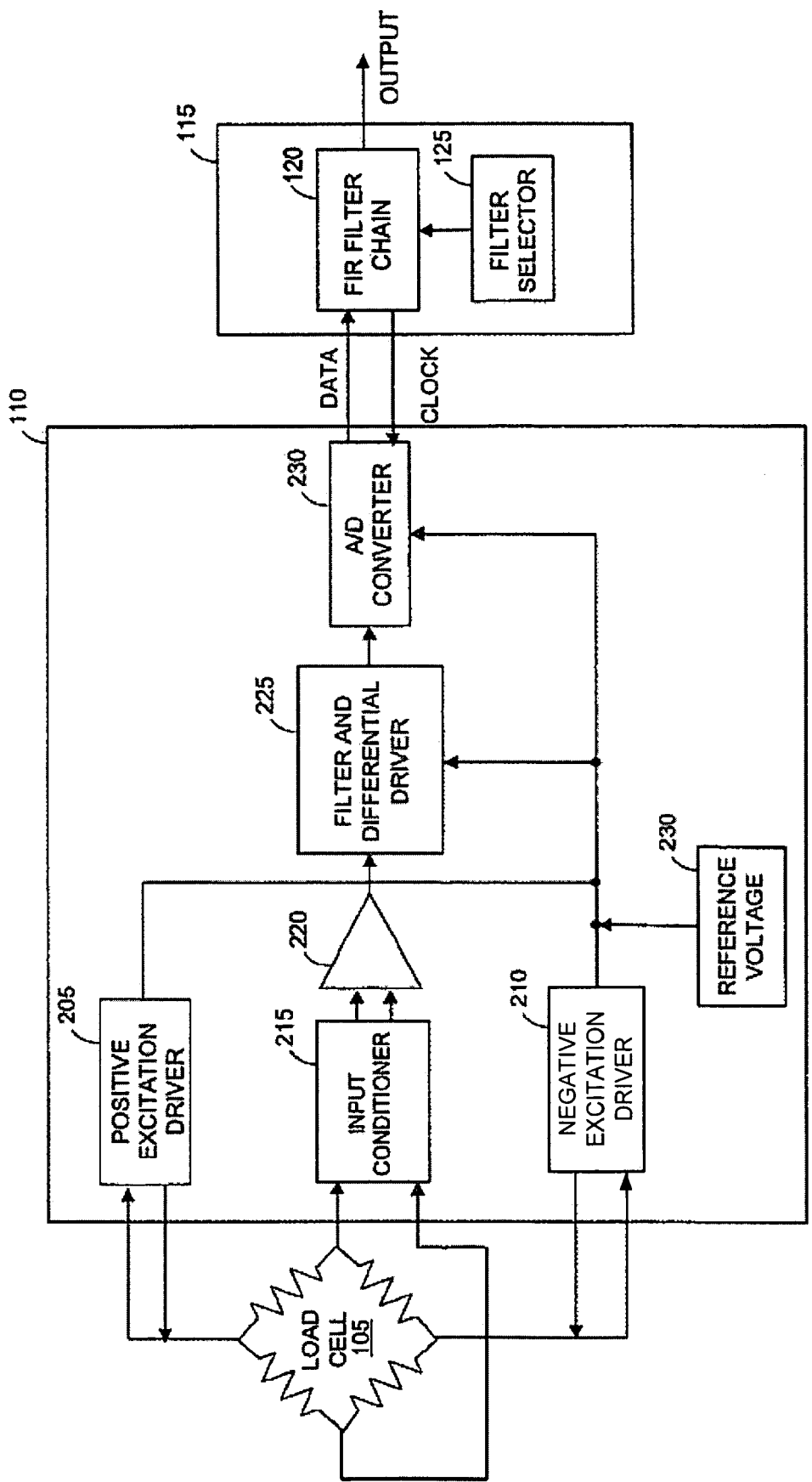
FIG. 2 is a block diagram illustrating an exemplary analog front end and digital signal processor (DSP) in accordance with the invention.

FIG. 2 is a block diagram illustrating the Analog Front End 110. The voltage signal from the load cell 105 is driven from a positive excitation driver 205 and negative excitation driver 210. The output voltage is input to an input condition 215, which provides a common mode filtering and surge protection. The output of the input conditioner 215 is then fed to a differential amplifier 220, which amplifies the analog signal by a predetermined factor and also converts the signal to a ground-referenced signal. The ground-referenced signal is then input to a filter and differential driver unit 225, which provides anti-aliasing filtering, gain, and the differential output required for driving the analog-to-digital converter 230.

The output of the filter and differential driver unit 225 is input into a A/D converter 230, which in the exemplary embodiment is a Delta-Sigma A/D converter. The A/D converter 230 uses a high sampling frequency to convert the analog signal to a digital. Typically, the sampling rate for the A/D converter is in the range of 275 kHz to 325 kHz. In the exemplary embodiment, the sampling frequency is 302.7 kHz because it lies with in the operating range of the A/D converter 230 and can be decimated down to 10 Hz using integer decimation filters. In general, the higher the sampling rate of the A/D converter 230, the more accurate the measurement of the load on the weigh board 105. The higher sampling rate allows for higher decimation ratios, which result in improved noise performance. The output of the A/D converter is then input to the FIR filter chain 120 in the DSP unit 115.

In addition to outputting a digital signal to the FIR filter chain unit 115, the A/D converter 230 receives a clock signal. The clock signal supplies a periodic pulsed signal, which sets the sampling rate of the A/D converter 230. The A/D converter 230 samples the analog signal from the filter and differential driver unit 225 and converts the sampled signal to a digital form once for each pulse supplied by the clock signal. The clock signal must have an accurate frequency and remain relatively stable over long periods of time and temperature ranges to allow the analog signal to be sampled at the appropriate rate. To achieve the high level of precision, a crystal-controlled clock is typically used. Those skilled in the art will appreciate that other clock mechanisms may be used to generate the clock signal without departing from the scope of the invention. The clock is generated by a timer within the DSP unit 115.

The clock signal is also applied to the FIR filter chain unit 120. The FIR filter chain unit 120 provides a decimation ratio of 30720:1 using a series of filters to progressively step down the sampling frequency while simultaneously filtering unwanted noise from the line voltage at 50 Hz and 60 Hz.

Figure 3:
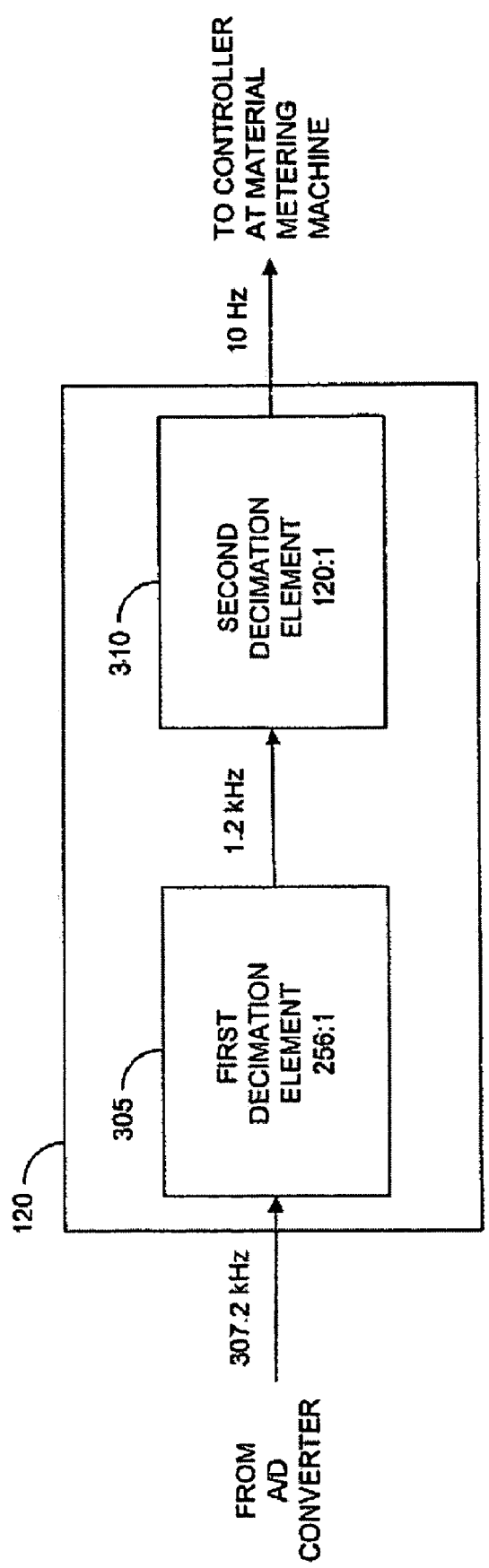
FIG. 3 is a block diagram illustrating an exemplary filter chain using two decimation elements.

FIG. 3 is a block diagram illustrating the main components of the FIR filter chain unit 120. The FIR filter chain unit 120 contains a first decimation element 305 and a second decimation element 310. The first decimation element has a decimation ratio of 256:1, which decimates the sampling frequency of the digital signal from 307.2 kHz, to 1200 Hz while filtering the noise from the A/D Converter 230 (FIG. 2). The second decimation element 310 has a decimation ratio of 120:1 to decimate the digital signal again from 1200 Hz to 10 Hz while further reduces the noise from the A/D Converter 230. However, the second decimation element simultaneously filters out the line noise of the digital signal while decimating the sampling frequency of the digital signal. Both the first decimation element 305 and the second decimation element 310 are implemented using one or more finite impulse response (FIR) filters, which are more fully described below.

In the exemplary embodiment, the FIR filters used in the first decimation element 305 and the second decimation element 310 are SINC filters. SINC filters are used to decimate the signal due to the benefits they offer in the frequency domain. For example, the frequency response of the SINC filter is substantially a square wave and provides for easily placement of nulls at multiple frequencies to provide the decimation ratios and filtering of excessive line noise. Infinite impulse response (IIR) filters may also be used although they require additional complexity to implement.

The first decimation element 305 performs a 256:1 reduction in the sample rate of the digital signal received from the A/D Converter 230, decimating the sampling rate of the signal from 307.2 kHz to 1.2 kHz. The decimation ratio of 256:1 is used because the A/D converter used outputs a signal with a sampling frequency of 307.2 kHz which must be reduced to 1200 Hz. However, if another DSP unit 115 is used that has a different sampling frequency, then the decimation ratio of the first decimation element 305 would be selected accordingly to produce an output signal sampled at 1.2 kHz. The important feature of the invention is that the first decimation element 305 must provide a signal to the second decimation element 310 with a sampling frequency of 1.2 kHz to allow the second element 310 to use integer decimation ratios to filter out the line noise.

The second decimation element 310 receives the digital output from the first decimation element 305 and performs a 120:1 reduction in the sample rate and outputs a digital signal with a sample rate of 10 Hz. The second decimation element 310 performs two functions. First, the second decimation element 310 provides additional filtering of the noise introduced into the signal by the A/D converter 230. Second, and most important, the second decimation element 310 filters out noise produced from the line voltage at 50 Hz and 60 Hz by stepping the signal through a number of FIR filters that have specific integer decimation ratios.

Figure 4:
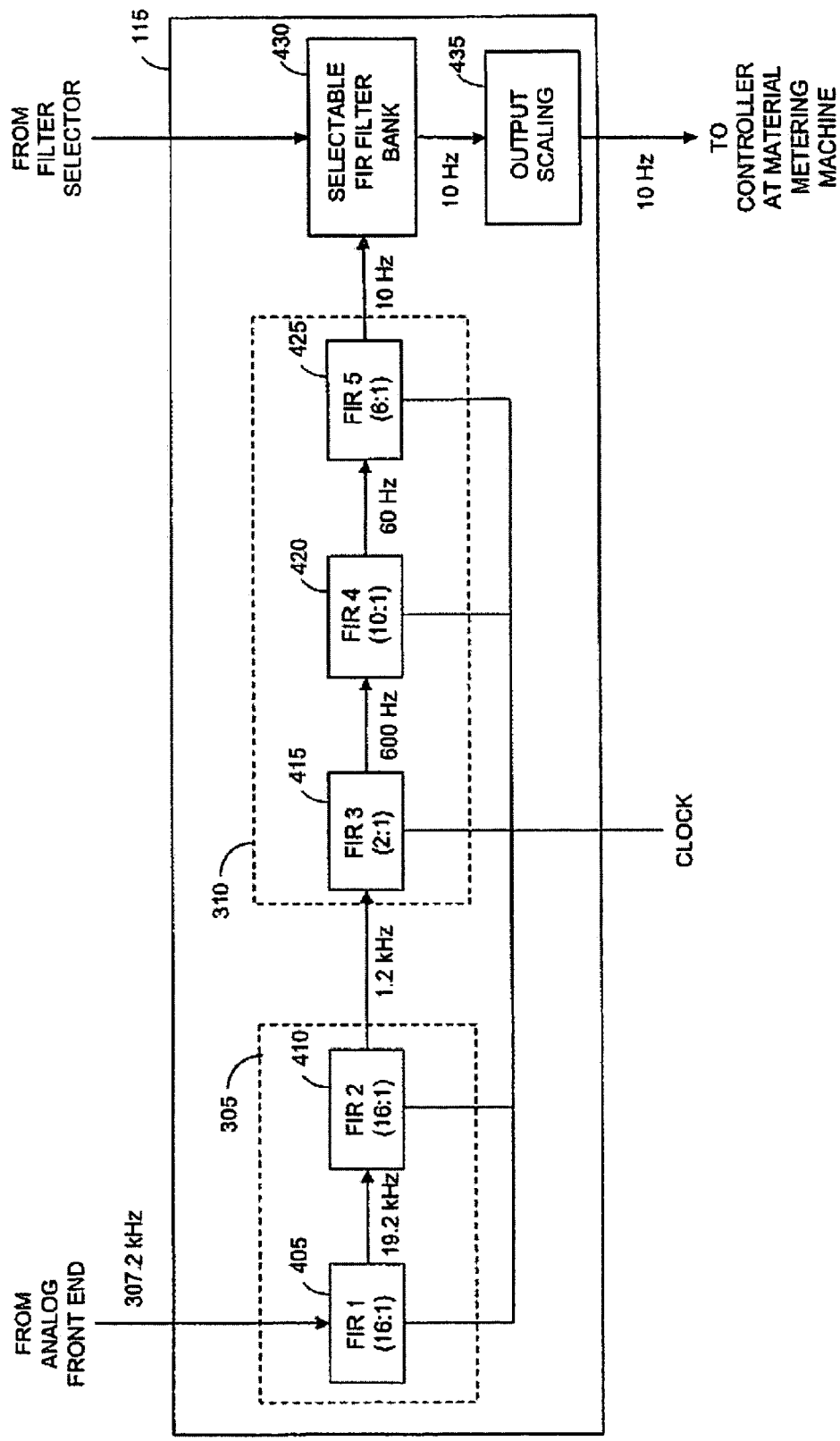
FIG. 4 is a block diagram illustrating an exemplary FIR filter chain in accordance with the invention.

FIG. 4 is a detailed block diagram of an exemplary FIR filter chain unit 115 in accordance with the present invention. The FIR filter chain unit 115 contains five FIR filters FIR1 405, FIR2 410, FIR3 415, FIR4 420, and FIR5 425. FIR1 405 and FIR2 410 may be combined to form the first decimation element 305 while FIR3 415, FIR4 420 and FIR5 425 are combined to form the second decimation element 310. As stated above, the goal of the first decimation element 305 is to remove unwanted noise produced by the A/D converter 230, while providing an output signal with a sampling rate of 1.2 kHz.

The sampling rate reduction and filtering process begins with FIR1 405. FIR1 405 receives a serial stream of data bits from the A/D converter 230 (FIG. 2). FIR1 405 treats the stream of data bits as individual one bit "words" that have a value of either "1" or "0." The sixty-one coefficients of FIR 1 405 are coded as 16-bit unsigned integers. This results in FIR1 405 generating a 17 bit word that has a maximum value of 65,536 if the 61 input samples contain the value "1." This value is not actually possible since the output of the A/D converter 230 has an output signal equal to 10 percent of the maximum load when there is no load applied to the load cell 105 and an output signal equal to 90 percent of the maximum load when the maximum load is applied to the load cell 105. However, should the A/D converter output the value of 65,536, the DSP unit 115 would substitute the maximum value of 65,535 to provide a 16-bit result. The 16-bit result is an exact value because the DSP unit 115 uses a 16-bit processor. Furthermore, an advantage of this technique is that the maximum precision is maintained because the DSP unit 115 performs 16-bit by 16-bit multiplications, which reduces errors introduced by rounding.

Figure 6:
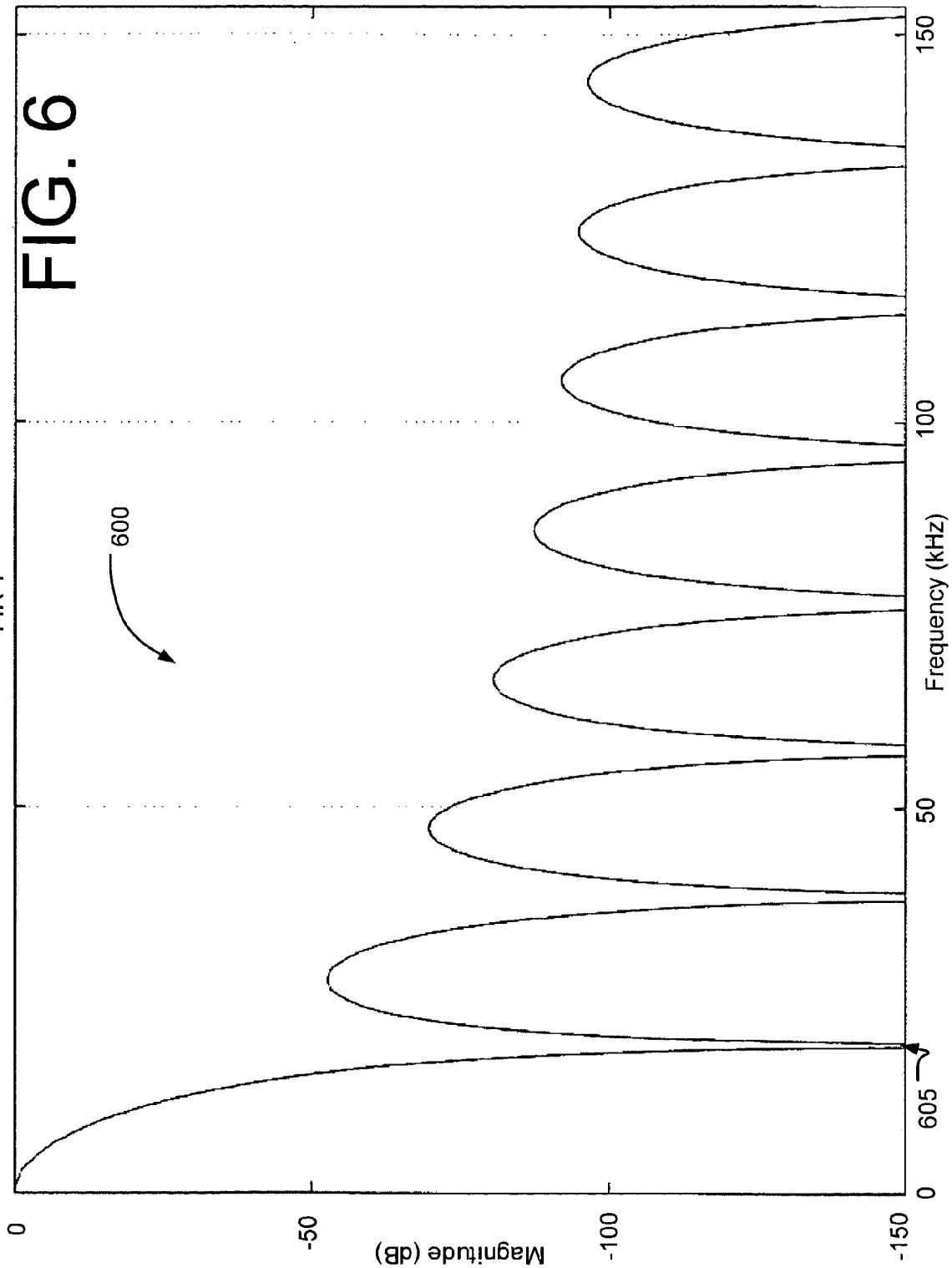
FIG. 6 is an illustration of an exemplary response curve for the FIR 1 filter of the FIR filter chain.

The calculation of the coefficients of FIR1 405 begins by calculating the moving average of 16 samples and providing an impulse to the filter. The output of the filter is then fed back through the averaging filter again two more times. This provides a FIR filter that has a response that contains nulls at frequencies equal to the input sampling frequency divided by the moving average length, which in the exemplary embodiment is 307.2 kHz/16 or 19.2 kHz. The response curve 600 for FIR1 405 is shown in FIG. 6. Thus, in FIR1 405, the response has nulls at 1.2 kHz/16 or 19.2 kHz. The null at 19.2 kHz is required because FIR2 410 will be sampling the output of FIR1 405 at the same frequency. The alias noise from FIR1 405 would fold back to direct current (DC), which is the signal of interest if a null was not located at that frequency The response curve 600 is generated by passing an impulse signal through the FIR1 405. The response curve 600 for the FIR1 405 contains a null 605 at the decimation frequency of 19.2 kHz.

Figure 7:
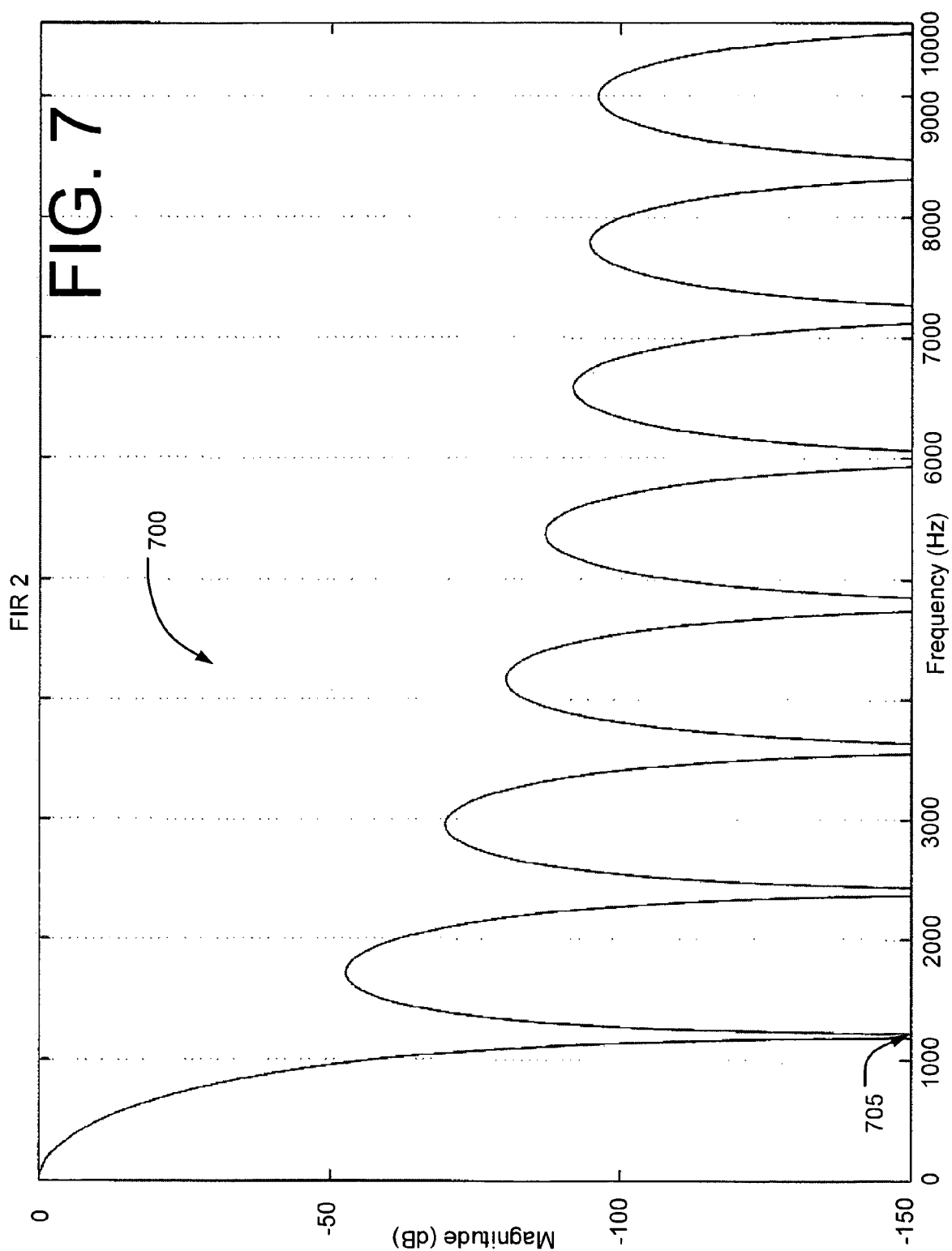
FIG. 7 is an illustration of an exemplary response curve for the FIR 2 filter of the FIR filter chain.

The output signal from FIR1 405 is input to FIR2 410. FIR2 410 also has a decimation ratio of 16:1, which permits the sampling frequency of the digital signal to be reduced from 19.2 kHz to 1.2 kHz. The output signal from FIR2 410 is 32 bits wide, which provides an exact value. Therefore, no rounding of the signal is required. The sampling rate of the output signal from FIR2 410 is set at 1.2 kHz. This is a harmonic multiple of both the 50 Hz and 60 Hz line frequencies, which allows the second decimation element 310 to use integer decimation ratios to filter the line noise. The response curve for the FIR2 410 filter is shown in FIG. 7, which contains a null 705 at 1.2 kHz due to the averaging length of 16.

Although the first decimation element contains two FIR filters to reduce the signal from the sampling frequency of 307.2 kHz down to 1.2 kHz, those skilled in the art will appreciate that any number of FIR filters may be used in the first decimation element 305 to reduce the input signal. The only requirement is that the output of the first decimation element has a sampling frequency of 1.2 kHz to allow the second decimation element 310 to use integer decimation ratios to reduce the sampling frequencies down to 10 Hz while simultaneously filtering out the line noise at the 50 Hz and 60 Hz frequencies.

Figure 8:
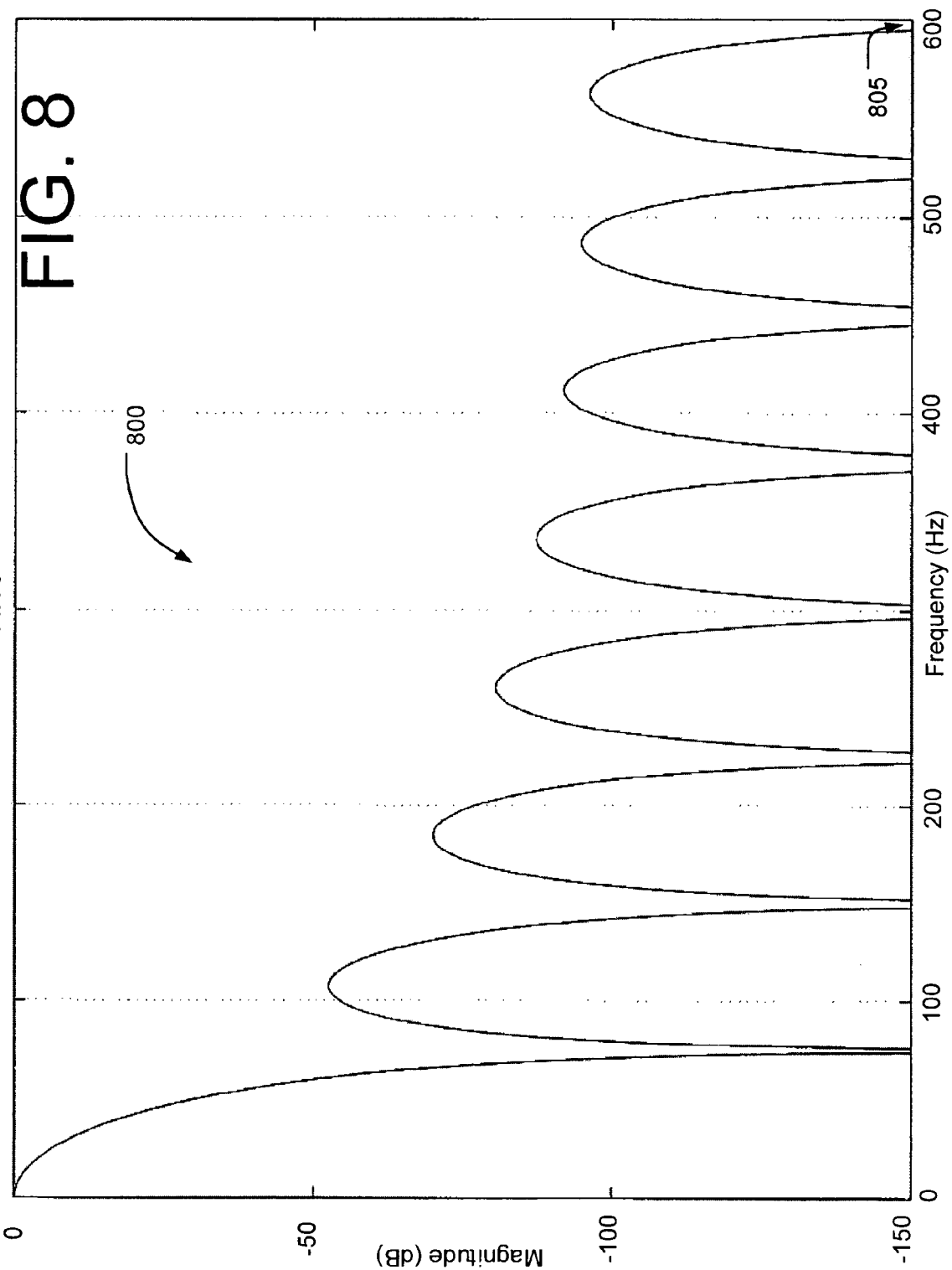
FIG. 8 is an illustration of an exemplary response curve for the FIR 3 filter of the FIR filter chain.

The output of FIR2 410 is then input into the second decimation element 310. In the exemplary embodiment, the second decimation element 310 contains three FIR filters, which sequentially reduces the sampling frequency of the signal down to 10 Hz using integer decimation ratios. The 1.2 kHz sampled output signal from FIR2 410 is input to FIR3 415, which has a decimation ratio of 2:1. FIR 415 is a moving average SINC filter with a length of 20. This provides nulls at the 60 Hz line frequency and its harmonics. FIR3 415 accepts the 32 bit words from FIR2 410 at a rate of 1.2 kHz and generates an output signal consisting of 32 bit words at a rate of 600 Hz. The 32-bit output has to be rounded because the internal result of FIR3 415 is 48 bits wide. It should be noted that rounding of the output does not alter the result, as the final output of the system will be 20 bits wide. Therefore, rounding the 48-bit word down to a 32-bit word does not affect the accuracy of the final output. The null at the $10^{th}$ harmonic at 600 Hz allows for the decimation of the signal, while the nulls at the 60 Hz frequency and the remaining harmonic frequencies provide the initial filtering of the line noise. Normally, a filter length of 2 would be selected to achieve a decimation ratio of 2:1. However, by using a filter length of 20, the correct filtering for line noise (1.2 kHz/20) at the 60 Hz frequency and its harmonics and the decimation of the signal are achieved simultaneously. The response curve for the FIR3 415 is shown in FIG. 8.

Figure 9:
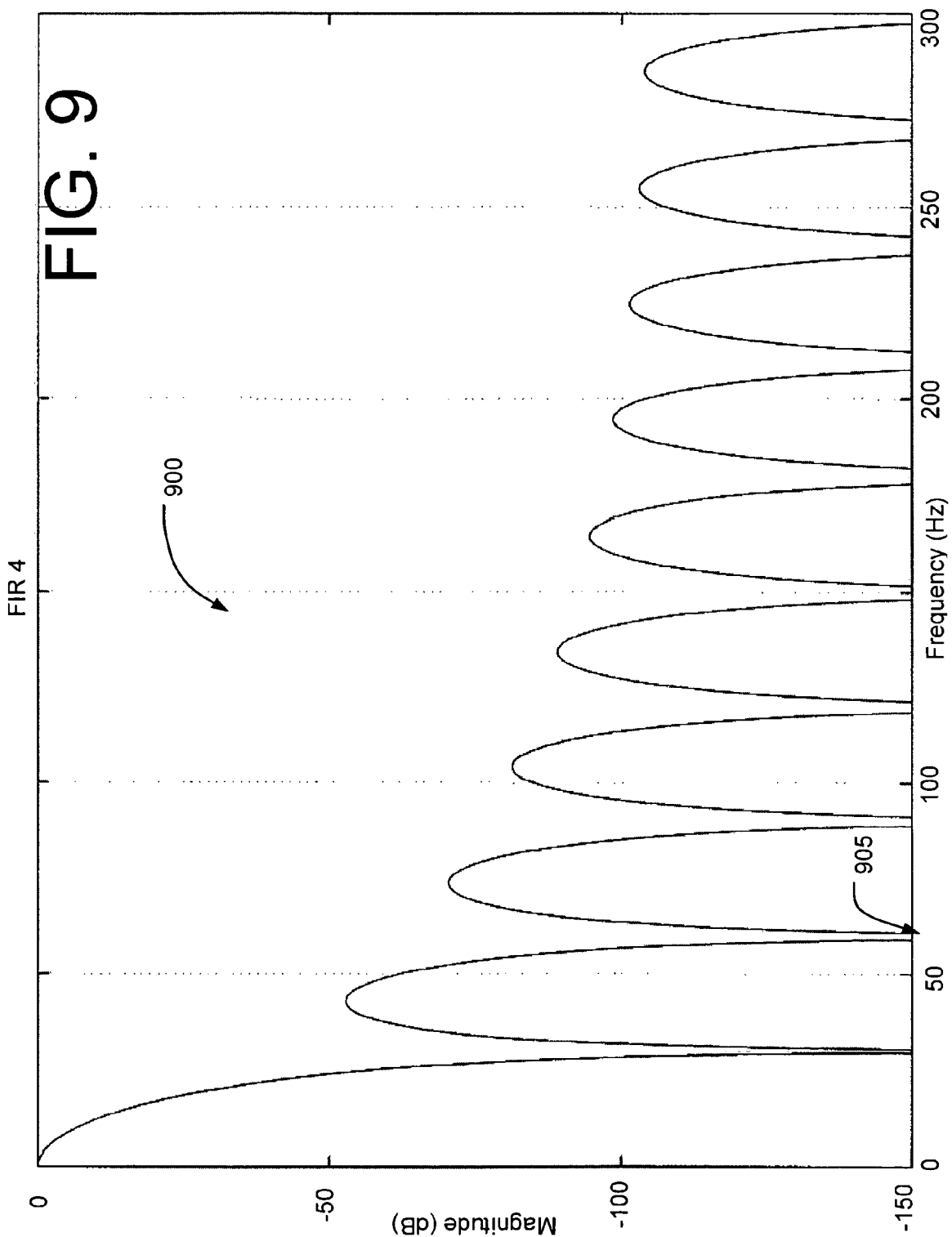
FIG. 9 is an illustration of an exemplary response curve for the FIR 4 filter of the FIR filter chain.

The output of FIR3 415 is then input to FIR4 420. FIR4 420 accepts the 32 bit word input samples from FIR3 415 at a rate of 600 Hz and outputs a 32 bit wide samples at 60 Hz, yielding decimation ratio of 10:1. The response curve for the FIR4 420 filter is shown in FIG. 9. As illustrated by the figure, the response curve 900 contains a null 905 at 60 Hz to filter out the line noise from the signal.

In the exemplary embodiment, FIR4 420 is a Multiple Pass Moving Average filter with an average length of 20 and an order of 4. This allows the placement of nulls at intervals of 30 Hz (600 Hz/20). Therefore, another null is placed at the 60 Hz frequency, further deepening and widening the notch in the frequency response curve, thereby adding to the improvement of the overall system performance. Just as in FIR3 415, FIR4 420 uses a longer length than is necessary to achieve the desired decimation ratio of 10:1. The longer filter length allows FIR4 420 to achieve the 10:1 decimation ratio and simultaneously providing additional filtering of the line noise at the 60 Hz frequency and its harmonics.

Figure 10:
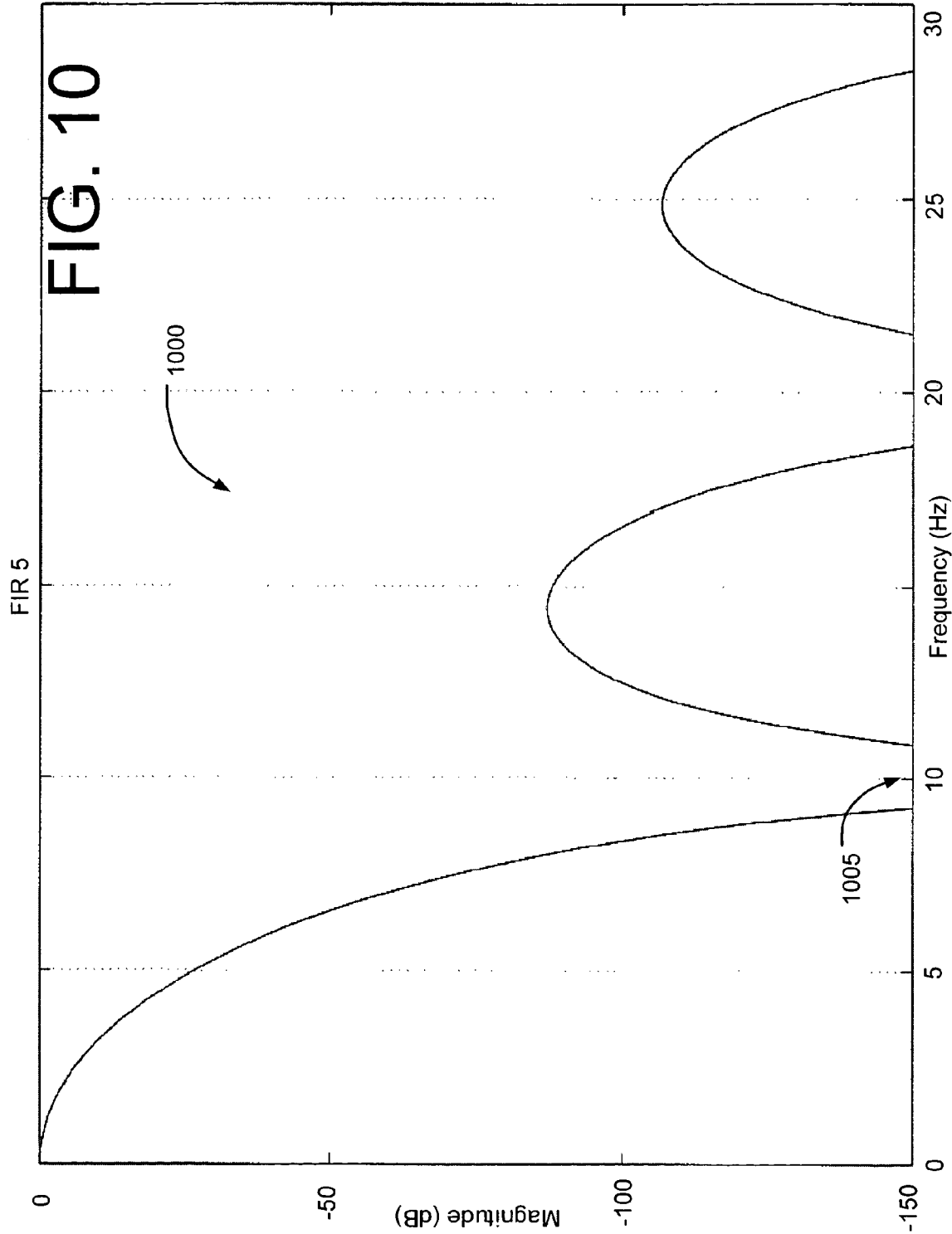
FIG. 10 is an illustration of an exemplary response curve for the FIR 5 filter of the FIR filter chain.

The final filter in the second decimation element 310 is FIR5 425. FIR5 425 has a decimation ratio of 6:1, thereby reducing the 60 Hz inputs sample from FIR4 420 and outputting a signal at 10 Hz. FIR5 425 has a length of 6, thereby providing the decimation ratio of 6:1 so there are nulls at each multiple of 10 Hz. This places nulls at the 50 Hz and 60 Hz line frequencies and their harmonics further reducing the noise associated with the line voltage. The response curve for FIR5 425 is shown in FIG. 10. The response curve 1000 includes a null 1005 at 10 Hz, which is the result of setting the length of the filter to 6.

The output of the FIR5 425 filter, which is a 10 Hz sampled signal 32 bits wide, is input to a selectable FIR filter bank 430. An appropriate filter is selected based on the machine's operational characteristics. For example, in the material metering machine, the rate of change in weight of the material passing through the hopper, the change in density of the material passing through the hopper, and machine can each generate noise at different frequencies. Therefore, the FIR selectable filter block 430 contains a number of filters having different 3-dB cutoff frequencies. The FIR selectable filter block 430 receives the output from FIR5 425 at the 10 Hz sampling frequency and output a signal to the machine at 10 Hz sampling frequency. Thus, the FIR selectable filter block 430 performs no decimation of the signal.

The output of the FIR selectable filter block 430 is passed to an output scaling block 435. The output scaling block 435 reduces the number of bits in the final signal from 32 bits down to 20 bits for use by the controller unit of the weight machine. In addition to reducing the number of bits in the output signal, the output scaling block 435 also makes adjustments for the case when there is no weight on the load cell 105. Normally, the A/D converter 230 (FIG. 2) will generate a signal of 10 percent of the full-scale weight when there is no load placed on the scale. Similarly, the A/D converter 230 only outputs a signal equal to 90 percent of the full-scale weight when the weigh board is fully loaded. For example, if the hopper has a full load weight of 2000 pounds, the A/D converter 230 will generate a signal equal to a weight 200 pounds when the hopper is empty and there is no load on the load cell, which would result to not enough material being dispensed. Similarly, if the hopper were fully loaded, the output signal would indicate that the load cell was loaded with only 1800 pounds, which would result in additional material being delivered. If uncorrected, this "adjustment" by the A/D converter would produce significant errors in weigh measurements requiring a precision of a tenth of an ounce. Therefore, the output scaling block adjusts the output signal for the no load weight to indicate zero and the output signal for the full load weight to read 1,048,576 (based on a twenty bit register, $2^{20}=1,048,576$). The output of the output scaling unit 435 is forwarded to the control unit of the hopper machine to control the flow of material dispensed from the hopper.

Figure 5:
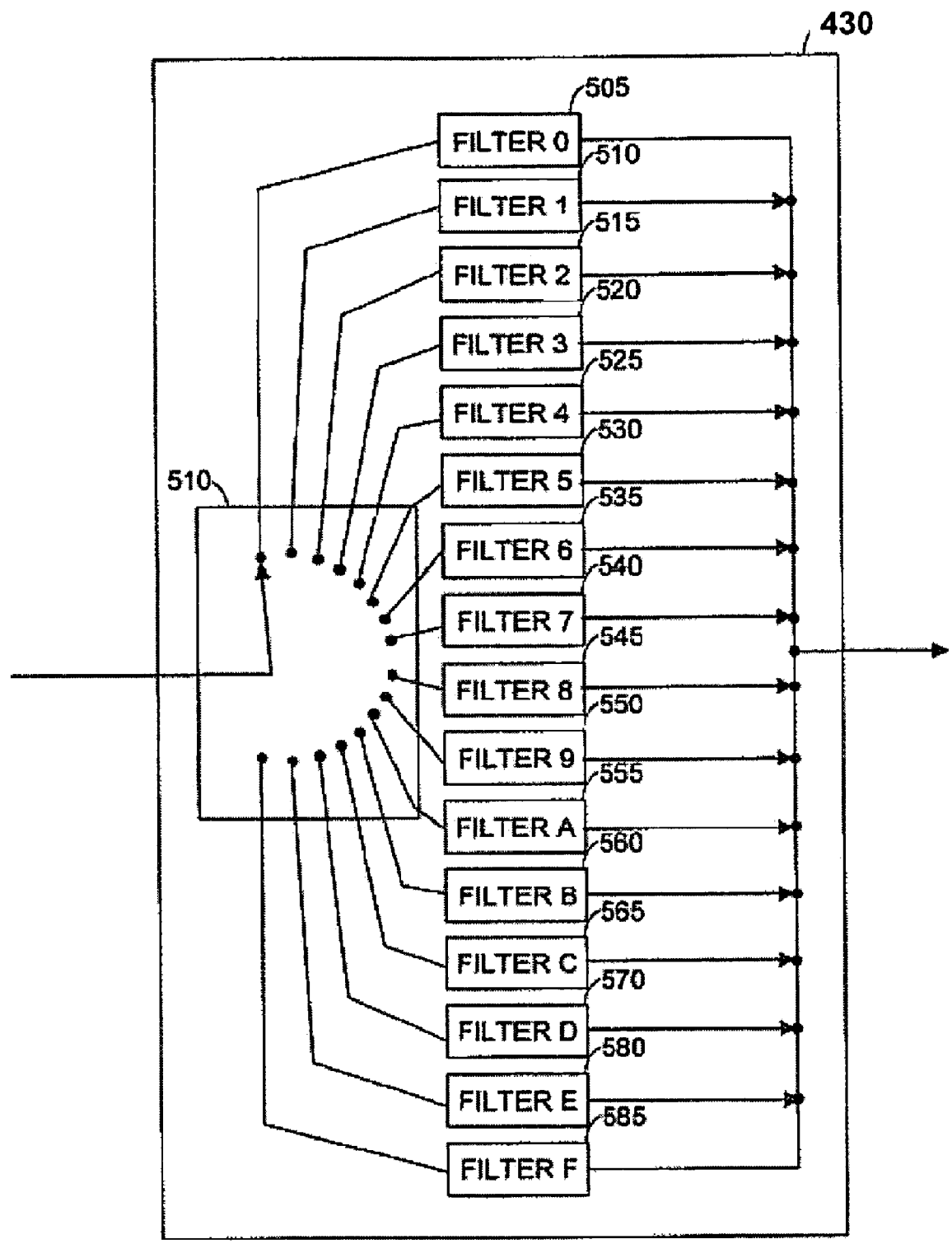
FIG. 5 is a block diagram illustrating an exemplary selectable filter bank in accordance with the invention.

FIG. 5 is an illustration of the selectable filter bank 430. In an exemplary embodiment, the selectable filter bank 430 contains 16 separate FIR filters. A switch 590 allows the selection of a single filter to be place in line to receive the output of FIR 5 425. The filters used in the exemplary embodiment and their operating characteristics are summarized in Table 1.

TABLE 1

Filter specifications for Selectable Filter Bank.

| Filter No. | Filter Type | No. of Taps | $F_C$ (Hz) |
| --- | --- | --- | --- |
| 0 | 30 SINC 3 | 88 | 0.10 |
| 1 | 24 SINC 3 | 70 | 0.12 |
| 2 | 20 SINC 3 | 58 | 0.15 |
| 3 | 16 SINC 3 | 46 | 0.20 |
| 4 | 12 SINC 3 | 34 | 0.25 |
| 5 | 10 SINC 3 | 28 | 0.32 |
| 6 | 8 SINC 3 | 22 | 0.40 |
| 7 | 6 SINC 3 | 16 | 0.50 |
| 8 | 4 SINC 3 | 10 | 0.70 |
| 9 | 3 SINC 3 | 7 | 1.00 |
| 10 | 2 SINC 3 | 7 | 2.00 |
| 11 | RAISED COSINE | 33 | 0.20 |
| 12 | RAISED COSINE | 33 | 0.30 |
| 13 | RAISED COSINE | 19 | 0.40 |
| 14 | SPECIAL | | |
| 15 | SPECIAL | | |

As is shown by Table 1, the selectable filter unit 430 can contain more than one type of filter. Filter 0 through Filter 10 are SINC filters, Filter 11 through Filter 13 are Raised Cosine filters, and Filters 14 and 15 are left open to accept any type of filter that may be useful for the material metering machine. Each of the filters has a 3-dB cutoff frequency of 2 Hz or less, with the majority of the filters operating in the sub-hertz region. The sub-hertz 3-dB cutoff frequencies allows the filters to have responses that are fast enough to track the change applied to the load cell, while still filtering out machine related noises.

Using SINC filters for the selectable FIR filters provides advantages in the time domain, such as its response to sharp changes in the load applied to the load cell 105. SINC filters have the advantage of being relatively immune to sharp changes in the input signal. For example, the SINC filter exhibits very little, if any, undershoot or overshoot in its time response to rapid changes in the input signal. This is an important feature in measuring the load applied to the load cell 105, as the final measured value is weight loss, and the rate of change of the weight loss (the derivative of the weight loss measurements). Therefore, it is important that the response of the filter be smooth and without any ripples.

The Raised Cosine filters also have no overshoot and undershoot, and therefore provide a smooth output response in response to a sharp increase of decrease to the load applied to the load cell 105. The response of the Raised Cosine filter is similar to the response of a COS+1 function. However, the Raised Cosine filter has less delay than the SINC filter, which can be critical in maintaining the stability of the filter in a fast closed loop system. Unfortunately, the reduction in delay comes at a price. The Raised Cosine filter does not have the same noise filtering capability of the SINC filter. Therefore, the Raised Cosine filters are typically used only when a fast response to the closed loop is needed to maintain stability. One important feature is that each of the filters in the selectable filter bank 430 are normalized to have the same gain. This allows the filters to be changed without having to re-calibrate the machine.

Upon installation of the machine, the default of the selectable filter bank 430 is set to Filter 3 520, which is a SINC filter with a length of 16, order 3, and a 3-dB cutoff frequency of 0.2 Hz. After the machine starts up and begins taking actual measurements, the closed loop performance parameters are examined by the filter selector unit 120 to determine whether any adjustments need to be made to the filter selection, specifically whether the 3-dB cutoff frequency need to be increased or decreased. The adjustments can be made without any sacrifice to the line noise immunity. This is due to the wide, deep nulls centered at the line noise frequencies of 50 Hz and at 60 Hz. Typically, the filter selector will switch between SINC filters with a different 3-dB cutoff frequency. However, if the filter selector unit 120 determines that a faster loop response is needed to maintain stability, the filter selector unit 120 may switch one of the SINC filters for a Raised Cosine filters or one of the Special filters.

FIG. 11 is an illustration of a total response curve 1100 for the entire FIR filter chain. The total response curve 1100 is calculated by adding the response curves from each of the five filters FIR1 through FIR 5. The total response curve 1100 contains a null 1105 at 10 Hz. The null 1105 is approximately −480 dB, which is sufficient to pass the 10 Hz digital signal to the selectable FIR filter bank 430 with minimal noise interfering with the signal. Also, the response curve 1100 contains a deep, wide null 1110 at 60 Hz, a wide null 1115 at 50 Hz, a null 1120 at 40 Hz, a very wide null 1125 at 30 Hz, and a null 1130 at 20 Hz, which effectively remove the line noise associated with the 50 Hz and 60 Hz frequencies from the power supply of the system.

Other alternative embodiments will become apparent to those skilled in the art to which an exemplary embodiment pertains without departing from its spirit and scope. Accordingly, the scope of the present invention is defined by the appended claims rather than the foregoing description.

What is claimed is:

1. A system, comprising:
   (A) a material metering machine having a load cell, the load cell being configured to generate an analog signal, the analog signal being indicative of a load on the load cell;
   (B) an analog-to-digital converter configured to convert the analog signal into a digital signal, the digital signal having a sampling rate of 307.2 kHz;
   (C) a preliminary decimation element comprising:
   (C1) a first finite-impulse-response (FIR) filter having a decimation ratio of 16, the first FIR filter being configured to reduce the sampling rate of the digital signal from 307.2 kHz to 19.2 kHz; and
   (C2) a second FIR filter serially coupled to the first FIR filter, the second FIR filter having a decimation ratio of 16, the second FIR filter being configured to reduce the sampling rate of the digital signal from 19.2 kHz to 1200 Hz;
   (D) a primary decimation element serially coupled to the preliminary decimation element, the primary decimation element comprising:
   (D1) a third FIR filter having a decimation ratio of 2, the third FIR filter being configured to reduce the sampling rate of the digital signal from 1200 Hz to 600 Hz;
   (D2) a fourth FIR filter having a decimation ratio of 10, the fourth FIR filter being configured to reduce the sampling rate of the digital signal from 600 Hz to 60 Hz; and
   (D3) a fifth FIR filter having a decimation ratio of 6, the fifth FIR filter being configured to reduce the sampling rate of the digital signal from 60 Hz to 10 Hz; and
   (E) a filter bank serially coupled to the primary decimation element, the filter bank comprising:
   (E1) selectable filters, each filter being configured to reduce the noise, the selectable filters including a filter having a sub-hertz 3-dB cutoff frequency, the selectable filters comprising a filter selected from the group consisting of:
   (E1a) a SINC filter; and
   (E1b) a raised cosine filter; and
   (E2) a selectable filter switch configured to select a selectable filter, the selectable filter being selected as a function of operating criteria, the operating criteria being associated with the material metering machine, the operating criteria being determined through a closed feedback loop.

2. The system of claim 1, wherein the preliminary decimation element, the primary decimation element, and the filter bank are located within a single digital signal processor.

3. A system, comprising:
   a material metering machine comprising a decimation element, the decimation element configured to reduce an initial sampling rate of a digital signal to a reduced sampling rate; and
   a filter bank, the filter bank comprising:
   an input node adapted to receive the digital signal from the decimation element, the digital signal having noise from the material metering machine; and
   selectable filters, each selectable filter having a sub-hertz 3-dB cutoff frequency, each filter being configured to reduce the noise.

4. The system of claim 3, wherein the decimation element and the filter bank are located within a single digital signal processor.

5. A filtering apparatus, comprising:
   a primary input node configured to receive a digital signal, the digital signal having an initial sampling rate, the digital signal further having line noise; and
   a primary decimation element having a decimation ratio, the primary decimation element further having a filter length, the primary decimation element being configured to reduce the line noise at 50 Hz, the primary decimation element further being configured to reduce the line noise at 60 Hz, the primary decimation element further being configured to reduce the initial sampling rate to a reduced sampling rate as a function of the decimation ratio;

further comprising the steps of:

receiving an analog data signal from a load cell, the load cell being located on a material metering machine; and converting the analog signal into the digital signal.

6. A filtering method, comprising the steps of:

receiving a digital signal, the digital signal having an initial sampling rate, the digital signal further having line noise;

filtering the line noise at 50 Hz;

flitering the line noise at 60 Hz; and reducing the initial sampling rate of the digital signal to a reduced sampling rate further comprising the steps of:

receiving an analog data signal from a load cell, the load cell being located on a material metering machine; and converting the analog signal into the digital signal.

7. The method of claim 6, wherein the step of converting the analog signal comprises the step of:

generating a digital signal having a sampling rate of 1200 Hz.

8. A filtering apparatus, comprising:

a primary input node configured to receive a digital signal, the digital signal having an initial sampling rate, the digital signal further having line noise; and a primary decimation element having a decimation ratio, the primary decimation elcment including a low pass filter having a filter length, the primary decimation element being configured to reduce the line noise at 50 Hz, the primary decimation element further being configured to reduce the line noise at 60 Hz, the primary decimation element further being configured to reduce the initial sampling rate to a reduced sampling rate as a function of the decimation ratio while simultaneously filtering line noise at 50 Hz and 60 Hz.

9. The apparatus of claim 8, wherein the reduced sampling rate is 10 Hz.

10. The apparatus of claim 8, wherein tbe initial sampling rate is 1200 Hz.

11. The apparatus of claim 8, wherein the primary input node and the primary decimation element are located within a single digital signal processor.

12. The apparatus of claim 8, wherein the primary decimation unit includes a series of fixed low pass filters.

13. The apparatus of claim 8, wherein the primary decimation unit produces nulls at integer multiples of 10 Hz to filter out the line noise at 50 Hz and 60 Hz.

14. The apparatus of claim 8, wherein the digital signal is a D.C. signal including small signal A.C. and the filter reduces the small signal A.C.

15. A filtering apparatus comprising:

a primary input node configured to receive a digital signal, the digital signal having an initial sampling rate, the digital signal further having line noise; and a primary decimation element having a decimation ratio, the primary decimation element having a filter length, the primary decimation element being configured to reduce the line noise at 50 Hz, the primary decimation element further being configured to reduce the line noise at 60 Hz, the primary decimation element further being configured to reduce the initial sampling rate to a reduced sampling rate as a function of the decimation ratio;

wherein the primary decimation element comprises:

a first filter having a decimation ratio of 2;

a second filter serially coupled to the first filter, the second filter having a decimation ratio of 10; and a third filter serially coupled to the second filter, the third filter having a decimation ratio of 6.

16. The apparatus of claim 8, further comprising an analog-to-digital (A/D) converter, the A/D converter being configured to receive an analog signal, the A/D converter further being configured to convert the analog signal into the digital signal, the A/D converter further being configured to provide the digital signal to the primary input node.

17. A filtering apparatus, comprising:

a primary input node configured to receive a digital signal, the digital signal having an initial sampling rate, the digital signal further having line noise; and a primary decimation element having a decimation ratio, the primary decimation element further having a filter length, the primary decimation element being configured to reduce the line noise at 50 Hz, the primary decimation element further being configured to reduce the line noise at 60 Hz, the primary decimation element further being configured to reduce the initial sampling rate to a reduced sampling rate as a function of the decimation ratio;

further comprising a preliminary decimation element having an input, the preliminary decimation element further having an output, the output of the preliminary decimation element being communicatively coupled to the primary input node, the preliminary decimation element comprising:

a first filter having a decimation ratio of 16; and a second filter serially coupled to the first filter, the second filter having a decimation ratio of 16.

18. The apparatus of claim 17, further comprising an analog-to-digital (A/D) converter, the A/D converter being configured to receive an analog signal, the A/D converter further being configured to digitize the analog signal, the A/D convener further being configured to provide the digitized signal to the input of the preliminary decimation element.

19. A filtering method, comprising the steps of:

receiving a digital signal, the digital signal having an initial sampling rate, the digital signal further having line noise;

reducing the line noise at 50 Hz and 60 Hz by filtering the line noise in the digital signal at 50 Hz and 60 Hz;

using a low pass filter, and simultaneously reducing the initial sampling rate of the digital signal to a reduced sampling rate.

20. The method of claim 19, wherein the digital signal is a D.C. signal including small signal A.C. and the filter reduces the small signal A.C.

21. The method of claim 19, wherein the filter produces nulls at integer multiples of 10 Hz to filter out the line noise at 50 Hz and 60 Hz.

22. The method of claim 19, wherein a series of fixed low pass filters are used to filter the digital signal.

23. The method of claim 19, further comprising the step of cascading the digital signal through multiple filters.

24. The method of claim 23, wherein the step of cascading the digital signal through multiple filters comprises the step of directing the digital signal through a filter having a decimation ratio of 16.

25. The method of claim 23, wherein the step of cascading the digital signal through multiple filters comprises the step of directing the digital signal through a filter having a decimation ratio of 2.

26. The method of claim 23, wherein the step of cascading the digital signal through multiple filters comprises the step of directing the digital signal through a filter having a decimation ratio of 10.

27. The method of claim 23, wherein the step of cascading the digital signal through multiple filters comprises the step of directing the digital signal through a filter having a decimation ratio of 6.

28. The method of claim 19, wherein the step of filtering the line noise at 50 Hz comprises the step of cascading the digital signal through multiple filters.

29. The method of claim 19, wherein the step of filtering the line noise at 60 Hz comprises the step of cascading the digital signal through multiple filters.

30. The method of claim 19, wherein the step of reducing the initial sampling rate comprises the step of cascading the digital signal through multiple filters.

31. The method of claim 19, wherein the step of receiving the digital signal comprises the step of receiving a digital signal having a sampling rate of 1200 Hz.

* * * * *